(12) United States Patent
Henn et al.

(10) Patent No.: US 9,876,158 B2
(45) Date of Patent: *Jan. 23, 2018

(54) COMPONENT COMPRISING STACKED FUNCTIONAL STRUCTURES AND METHOD FOR PRODUCING SAME

(71) Applicant: Snaptrack Inc., San Diego, CA (US)

(72) Inventors: Gudrun Henn, Ebenhausen (DE); Thomas Metzger, München (DE)

(73) Assignee: SnapTrack, Inc., San Diego, CA (US)

( * ) Notice: Subject to any disclaimer, the term of this patent is extended or adjusted under 35 U.S.C. 154(b) by 405 days.

This patent is subject to a terminal disclaimer.

(21) Appl. No.: 14/766,674

(22) PCT Filed: Feb. 27, 2014

(86) PCT No.: PCT/EP2014/053860
§ 371 (c)(1),
(2) Date: Aug. 7, 2015

(87) PCT Pub. No.: WO2014/135442
PCT Pub. Date: Sep. 12, 2014

(65) Prior Publication Data
US 2015/0380634 A1  Dec. 31, 2015

(30) Foreign Application Priority Data

Mar. 6, 2013 (DE) ........................ 10 2013 102 206

(51) Int. Cl.
*H01L 41/053* (2006.01)
*H01L 41/22* (2013.01)
(Continued)

(52) U.S. Cl.
CPC ....... *H01L 41/0533* (2013.01); *H03H 9/0547* (2013.01); *H05K 3/30* (2013.01); *H05K 13/0023* (2013.01)

(58) Field of Classification Search
CPC .................................................... B81B 7/02
(Continued)

(56) References Cited

U.S. PATENT DOCUMENTS 5,300,915 A * 4/1994 Higashi ..................... G01J 5/20
250/338.4
6,087,759 A   7/2000 Pfeil
(Continued)

FOREIGN PATENT DOCUMENTS

CN      202785632    *  3/2013  ............... B81B 7/00
DE      19649332 C1     1/1998
(Continued)

OTHER PUBLICATIONS

International Search Report and Written Opinion—PCT/EP2014/053860—ISA/EPO—dated Jul. 2, 2014.
(Continued)

*Primary Examiner* — Thomas Dougherty
(74) *Attorney, Agent, or Firm* — Patterson & Sheridan, L.L.P

(57) ABSTRACT

A component suitable for miniaturization and comprising acoustically decoupled functional structures is specified. The component comprises a first functional structure, a first thin-film cover, which covers the first functional structure, and a second functional structure above the thin-film cover. The thin-film cover does not touch the first functional structure.

20 Claims, 7 Drawing Sheets

(51) Int. Cl.
*H03H 9/05* (2006.01)
*H05K 3/30* (2006.01)
*H05K 13/00* (2006.01)

(58) Field of Classification Search
USPC ................... 310/340, 344, 348; 29/25.35
See application file for complete search history.

(56) References Cited

U.S. PATENT DOCUMENTS

| | | | |
|---|---|---|---|
| 7,038,559 B2 | 5/2006 | Ruby et al. | |
| 7,492,019 B2 * | 2/2009 | Carley | B81C 1/00333 257/415 |
| 7,522,020 B2 | 4/2009 | Kando | |
| 7,675,154 B2 | 3/2010 | Hong et al. | |
| 2003/0045181 A1 | 3/2003 | Okazaki | |
| 2005/0266614 A1 | 12/2005 | Aoyagi | |
| 2016/0016790 A1 * | 1/2016 | Marksteiner | B81C 1/00293 257/416 |

FOREIGN PATENT DOCUMENTS

| | | | | |
|---|---|---|---|---|
| DE | 102013102213 | * | 9/2014 | ............ B81B 7/02 |
| DE | 102013102223 | * | 9/2014 | ............ H03H 9/10 |
| DE | 102014117599 | * | 6/2016 | ............ B81B 7/02 |
| EP | 2034610 A1 | | 3/2009 | |
| JP | 5991719 | * | 5/1984 | ............ H03H 9/02 |
| JP | 62081539 | * | 4/1987 | ............ G01L 7/08 |
| JP | 2005244966 A | | 9/2005 | |
| JP | 2006186747 A | | 7/2006 | |
| JP | 2007060465 A | | 3/2007 | |
| JP | 2007202130 A | | 8/2007 | |

OTHER PUBLICATIONS

Lakin, K.M., et al., "Bulk Acoustic Wave Resonators and Filters for Applications Above 2 GHz," MTT-S 2002 Paper TH1D-6 Expanded, Jun. 7, 2002, 6 pages.
Lakin, K.M., et al., "High Performance Stacked Crystal Filters for GPS and Wide Bandwidth Applications," IEEE 2001 Ultrasonics Symposium Paper 3E-6, Oct. 9, 2001, 6 pages.
Lakin, K.M., et al., "Wide Bandwidth Thin Film BAW Filters," Paper U4D-1 IEEE UFFC Draft, Aug. 25, 2004, 4 pages.

* cited by examiner

COMPONENT COMPRISING STACKED FUNCTIONAL STRUCTURES AND METHOD FOR PRODUCING SAME

This patent application is a national phase filing under section 371 of PCT/EP2014/053860, filed Feb. 27, 2014, which claims the priority of German patent application 10 2013 102 206.5, filed Mar. 6, 2013, each of which is incorporated herein by reference in its entirety.

TECHNICAL FIELD

The invention relates to components which have functional structures, e.g., structures operating with acoustic waves, and are suitable for being produced with small external dimensions. Methods for producing such components are furthermore specified.

BACKGROUND

Components, in particular those which are used in portable communication devices, are subject to a lasting trend toward miniaturization. They include components which have mechanically or electromechanically active structures. If the spatial distances between these structures shrink, then the risk of mutual influencing increases.

Furthermore, it is often desired to separate such functional structures spatially or hermetically from their environment.

The article "High Performance Stacked Crystal Filters for GPS and Wide Bandwidth Applications" by K. M. Lakin et al. (IEEE 2001 Ultrasonic Symposium Paper 3E-6; Oct. 9, 2001) discloses SCFs (SCF=Stacked Crystal Filter) which operate with BAWs (BAW=Bulk Acoustic Wave) and comprise, stacked one above another, layers of a piezoelectric material in which bulk acoustic waves are excitable. In this case, the two layers are acoustically coupled to one another, resulting in characteristic electrical properties.

The article "Wide Bandwidth Thin Film BAW Filters" by K. M. Lakin et al. (Paper U4D-1 IEEE UFFC Aug. 25, 2004) discloses RF filters which operate with bulk acoustic waves, wherein two piezoelectric layers are arranged one directly above the other or are connected to one another via a coupling layer.

The article "Bulk Acoustic Wave Resonators and Filters for Applications Above 2 GHZ" by K. M. Lakin (MTT-S 2002 Paper THID-6 Expanded) likewise discloses RF filter structures comprising coupled piezoelectric layers in which bulk acoustic waves are capable of propagation.

The U.S. Pat. No. 7,522,020 B2 discloses filter components operating with GBAWs (GBAW=Guided Bulk Acoustic Wave), wherein electrode structures are arranged at an underside and on a top side of a substrate.

What is generally problematic about known components which have mechanically or electromechanically active structures and which are intended to be suitable for being constructed with small dimensions in accordance with the ongoing trend toward miniaturization is the mechanical coupling between precisely these functional structures.

SUMMARY

Embodiments of the invention specify a component comprising a plurality of functional structures, which component can be produced with smaller external dimensions but without disadvantageous coupling between the structures. Further embodiments specify a method for producing such components.

A component comprises a first functional structure and a first thin-film cover and a second functional structure. In this case, the first thin-film cover covers the first functional structure, without touching the first functional structure. The second functional structure is arranged directly on or above the first thin-film cover.

It has been discovered that covers comprising a thin film are well suited firstly to encapsulating first functional structures and furthermore to constituting a possibility of accommodating for further, second functional structures. In this case, the thin-film cover can form a cavity on a carrier, such that the first functional structure is arranged in the cavity, without touching the thin-film cover. The second functional structure, which is arranged above the first thin-film cover and thus also above the first functional structure, is thus likewise separated by the cavity from the first functional structure and is mechanically decoupled therefrom. In contrast to piezoelectric layers operating with acoustic waves in SCFs, the first functional structure and the second functional structure are mechanically and acoustically decoupled, such that mutual influencing and disturbances are precluded or at least greatly suppressed.

In this case, the thin-film cover can bear tightly on the carrier substrate in a manner hermetically sealing a cavity and constitute a hermetic encapsulation for the first functional structure. However, it is also possible for the thin-film cover to have an opening, such that the first functional structure can be in contact with the environment, e.g., if the first functional structure is a gas, pressure or sound sensor.

For this purpose, the thin-film cover can be produced by means of a TFP technology (TFP=thin-film package) and comprise silicon, silicon nitride, aluminum nitride, aluminum oxide, a metal or a polymer.

Overall a component is specified in which features of the actually alternative BAW resonator forms, namely bridge-type BAW resonators having a cavity or clearance, on the one hand and SMR (Solidly Mounted Resonator) having monolithic integration of functional structures, on the other hand, can be combined.

In one embodiment, the first functional structure and the second functional structure are selected from: an SAW structure (SAW=Surface Acoustic Wave), a BAW structure (BAW=Bulk Acoustic Wave), a GBAW structure (GBAW=Guided Bulk Acoustic Wave), and an MEMS structure (MEMS=Micro Electro Mechanical System).

In this case, the first functional structure and the second functional structure can be of the same type or comprise different structure types.

If the first functional structure is an SAW structure, for example, then it contains electrode fingers which can be used to excite acoustic waves. Analogously, the first functional structure comprises piezoelectric material arranged between electrode layers if a BAW structure is involved. Although a GBAW structure, by virtue of the fact that electrode structures are embedded below a cover layer, already has a certain mechanical robustness and acoustic independence, a GBAW structure can benefit from being arranged in a cavity below a thin-film cover. An MEMS structure can comprise, e.g., mechanical RF switches with movable electrode structures. SAW structures, BAW structures and GBAW structures here represent special cases of the generic term MEMS structure.

In general, MEMS structures have movable or oscillatory elements which react sensitively to oscillations or movements of adjacent structures. As a result of the isolation of the first functional structure from the second functional structure, transmission of movement or oscillation is practically precluded as a result of the presence of the cavity.

In one embodiment, the first functional structure and the second functional structure substantially have the same construction or are of the same type. It is also possible for the first functional structure and the second functional structure to be arranged either with an identical orientation with respect to one another one directly above the other or with a lateral offset one above the other. It is also possible for the first functional structure and the second functional structure to be arranged symmetrically with respect to a mirror plane, which lies between the structures, one directly above the other or with a lateral offset one above the other.

The first functional structure and the second functional structure can, e.g., be SAW structures and constitute parts of an RF filter. In this regard, the first functional structure can constitute a part of a transmission filter and the second functional structure can constitute a part of a reception filter. Transmission and reception filters operate at adjacent but different RF frequencies. In this case, the RF frequencies determine the average finger distance between the electrode fingers. The first functional structure and the second functional structure can thus both be SAW structures but their geometrical details differ in detail.

If both functional structures have the same orientation, then the position of the second functional structure can be obtained from the position of the first functional structure essentially by displacement along the three spatial axes. However, it is also possible for the second functional structure to be rotated by 180° relative to the first functional structure and/or subsequently to be displaced parallel to the spatial axes.

In one embodiment, the first functional structure is arranged in a cavity between a carrier substrate and the first thin-film cover.

Here, e.g., in the case of a BAW structure, the carrier substrate can be an Si wafer (Si=silicon). In the case of an SAW structure or a GBAW structure, the carrier substrate can be piezoelectric and comprise, e.g., quartz, $LiTaO_3$ (lithium tantalate) or $LiNbO_3$ (lithium niobate).

The cavity here can have a height of a few micrometers, e.g., a height of between 2 μm and 10 μm. The distance between the first functional structure and the thin-film cover as wall or lid of the cavity can likewise be of the order of magnitude of a few micrometers, e.g., between 2 μm and 10 μm.

In one embodiment, a planarization layer having a planar surface is arranged on the first thin-film cover.

It is possible for the thin-film cover to be produced by a thin-film production method in which the form of the thin-film cover substantially reflects the form of the underlying material. The thin-film cover would then not have a planar top side. Advantageously, since the second functional structure is arranged above the thin-film cover, however, the second functional structure bears on a planar top side. The planarization layer therebetween can bear directly on the thin-film cover and be planarized over a large area such that at least the second functional structure can be fitted simply directly on the planarization layer or above the planarization layer.

In this case, the planarization layer can have an average thickness of a few micrometers, e.g., between 10 μm and 50 μm. The planarization layer can comprise a silicon oxide, e.g., $SiO_2$ (silicon dioxide), a polymer, a spin-on glass, plastic or generally a dielectric material, but also a metal. Advantageously, the planarization layer has a high mechanical strength.

The planarization layer can be planarized by chemical mechanical polishing (CMP) using a fine grinding disk with simultaneous rinsing by suitable chemicals such that the roughness in the range of a few nanometers or less is obtained. The planarization layer can be applied by means of conventional layer applying methods, e.g., CVD (Chemical Vapor Deposition), PVD (Physical Vapor Deposition).

In one embodiment, the first functional structure and the second functional structure in each case comprise an acoustically active region, which are acoustically decoupled.

Acoustic waves propagating in solids are substantially completely reflected at the surface with respect to vacuum or with respect to a gas, since the jump in impedance between the solid matter and vacuum or gas is sufficiently great. The cavity formed by the first thin-film cover ensures precisely said jump in impedance and thereby enables the acoustic decoupling.

In one embodiment, the component comprises a plated-through hole through the first thin-film cover. The first functional structure and the second functional structure in each case comprise an electrically conductive electrode, wherein the two electrodes are interconnected with one another via the plated-through hole.

As a result, it is possible to interconnect acoustically decoupled electrical structures in order to obtain, for example, improved RF filters, balun circuits (balun=Balanced-Unbalanced Converter) or duplexer circuits.

In this regard, in one embodiment, the first functional structure and the second functional structure are interconnected and together form at least parts of a balun or duplexer circuit.

The second functional structure can be connected to a second substrate. If the second functional structure is likewise a structure that is mechanically sensitive or to be decoupled, then the second functional structure can likewise be covered by a cap, a lid wafer or a further, second thin-film cover.

In particular, it is possible for the first functional structure to be a BAW structure and for the second functional structure to be formed as a BAW structure on or above a planarization layer above the first functional structure. In this case, the quality of BAW structures is greatly dependent on the crystallographic quality of the piezoelectric layers. The deposition of a piezoelectric layer in a conventional BAW component is readily controllable in this case. However, obtaining a good crystallographic quality of a second piezoelectric layer, arranged thereon, of a second BAW resonator has proved to be problematic. It has now been discovered that using a thin-film cover above the first functional structure it is possible to obtain a surface whose texture is well suited to the deposition of a second piezoelectric layer together with the electrode structures thereof.

Therefore, the arrangement of the functional structure using a thin-film cover therebetween makes it possible for the first time to obtain and interconnect stacked but acoustically isolated BAW resonators.

In one embodiment, the component furthermore comprises a circuit element which is arranged between the first functional structure and the second functional structure. The circuit element is interconnected at least with the first or with the second functional structure.

The arrangement of the second functional structure above the cavity in which the first functional structure is arranged enables the further integration of circuit elements in intermediate layers between said functional structures, since the acoustic or mechanical decoupling between the structures is maintained. RF filters and/or duplexers generally require impedance matching elements, e.g., inductive or capacitive elements or striplines, which can be arranged as metalized structures in intermediate layers between dielectric layers, without appreciably enlarging the component dimensions.

Accordingly, in one embodiment, the circuit element is a capacitive or an inductive element.

The component can comprise further circuit elements in the same intermediate layer or in further intermediate layers between the functional structures, below the first functional structure or above the second functional structure.

It is furthermore possible to arrange two planarization layers between the functional structures. This enables a simple manner of producing a corresponding component. In this case, two component parts of the component are produced separately and subsequently connected such that one planarization layer above one functional structure and a second planarization layer of the second component part are connected and produce a common planarization layer.

One method for producing a component comprises the following steps of providing a first carrier, and producing a first functional structure on the first carrier. The method further includes producing a first thin film cover above the first functional structure, wherein the first thin-film cover covers the first functional structure without touching it. The method further includes producing a second functional structure directly on or above the first thin-film cover.

An alternative method for producing a component comprises the following steps of producing a first and a second component part and joining together both component parts. The first component part is produced by providing a first carrier, producing a first functional structure on the first carrier, and producing a first thin-film cover above the first functional structure. The first thin-film cover covers the first functional structure without touching it. The method of producing the second component part comprises the following steps of providing a second carrier, and producing a second functional structure on the second carrier.

In one configuration of one of the two alternatives, a first sacrificial layer is applied on the first functional structure for the purpose of producing the thin-film cover. The thin-film cover is subsequently deposited on the first sacrificial layer. The first sacrificial layer is then removed below the thin-film cover, such that a cavity encompassed by the thin-film cover is obtained.

In this case, the sacrificial layer can be removed through previously structured holes in the thin-film cover or in some other way.

BRIEF DESCRIPTION OF THE DRAWINGS

The component and methods for producing a component are explained in greater detail below with reference to schematic figures.

In the figures.

DETAILED DESCRIPTION OF ILLUSTRATIVE EMBODIMENTS

Figure 1:
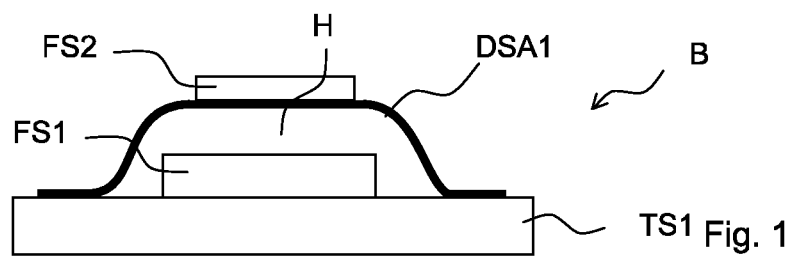
FIG. 1 shows a component comprising a first functional structure and a second functional structure.

FIG. 1 shows a component B comprising a first functional structure FS1 on a first carrier substrate TS1. The first functional structure FS1 is covered by a first thin-film cover DSA1, such that the first functional structure FS1 is situated in a cavity and does not touch the first thin-film cover DSA1. A second functional structure FS2 is arranged on the first thin-film cover DSA1. The two functional structures FS1, FS2 are mechanically and acoustically decoupled by the cavity H formed by the first thin-film cover DSA1.

Figure 2:
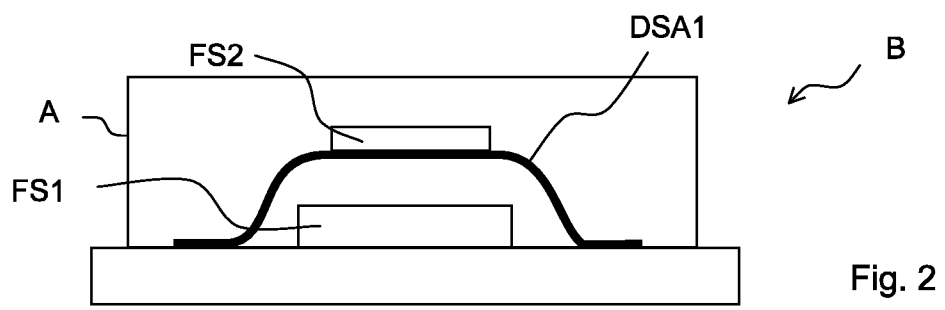
FIG. 2 shows a component in which the second functional structure is covered by a cover.

FIG. 2 shows one embodiment of a component B in which a further cover A is provided in order to protect the second functional structure FS2 from harmful external influences, e.g., from contamination or destruction. In this case, the cover A can be a lid wafer composed of a dielectric substrate material or serve as a metal or polymer cap for protecting the second functional structure or the (first) thin-film cover.

Figure 3:
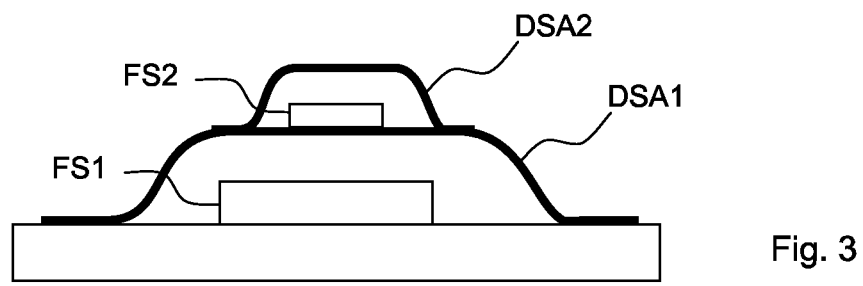
FIG. 3 shows one embodiment of a component in which the second functional structure is covered by a second thin-film cover.

FIG. 3 shows one embodiment in which the second functional structure FS2 is likewise covered and encapsulated by a thin-film cover, namely by a second thin-film cover DSA2, such that the second functional structure FS2 is likewise situated in a cavity.

Figure 4:
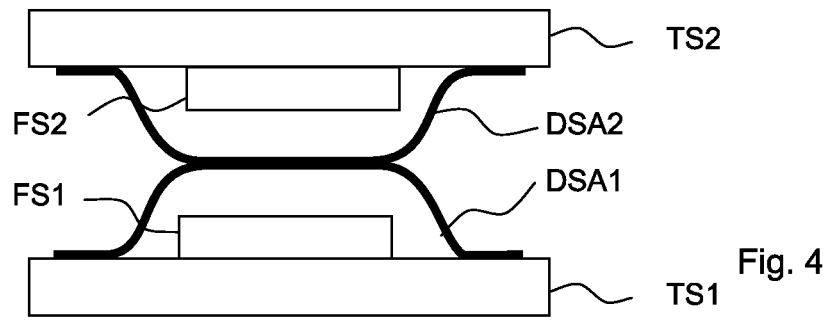
FIG. 4 shows one embodiment of a component in which the component consists of two component parts joined together "lid to lid"

FIG. 4 shows one embodiment in which the first functional structure FS1 is arranged on a first carrier substrate TS2. The second functional structure FS2 is connected to a second carrier substrate TS2. Both functional structures are covered directly by a thin-film cover DSA1 and DSA2, respectively. In this case, both thin-film covers are arranged one on top of the other such that the functional structures FS1, FS2 are arranged between the carrier substrates TS1, TS2.

Figure 5:
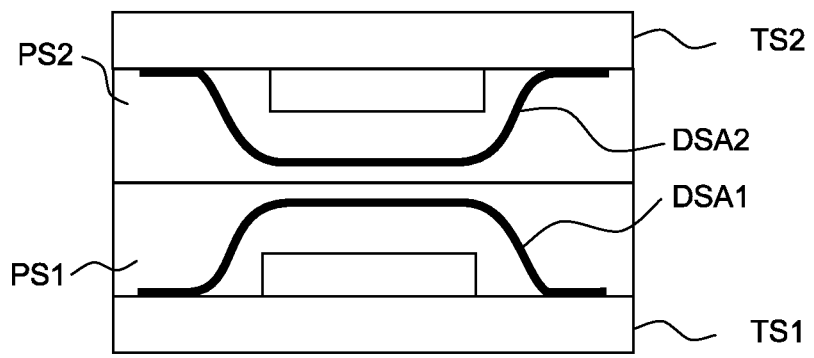
FIG. 5 shows an embodiment in which the component is obtained by two planarization layers being joined together.

FIG. 5 shows one embodiment in which—analogously to the embodiment in FIG. 4—the first functional structure and the second functional structure are in each case covered by a thin-film cover DSA1, DSA2 and are arranged between the first and second carrier substrates TS1, TS2. In this case, each of the thin-film covers DSA1, DSA2 is arranged between a planarization layer PS1 and respectively PS2 and the corresponding carrier substrate TS1 and respectively TS2. The planarization layers both have a smooth top side via which the two component parts of the component touch one another. In this case, the two planarization layers can be bonded or adhesively bonded to one another. This gives rise to a stable connection and a correspondingly stable component.

Figure 6:
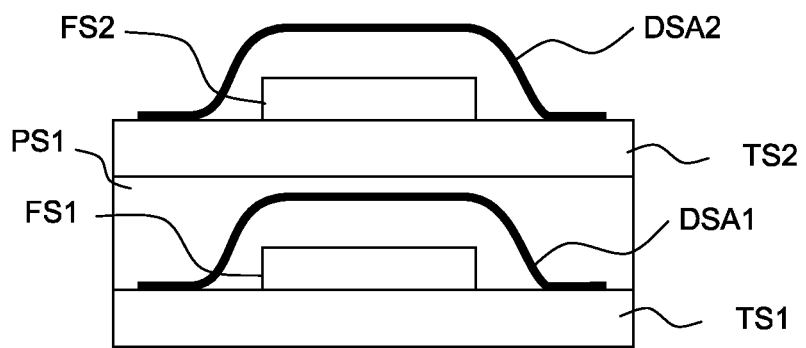
FIG. 6 shows one embodiment in which a second carrier substrate is arranged on a planarization layer.

FIG. 6 shows one embodiment in which the first thin-film cover DSA1 is covered by a first planarization layer PS1. On the first planarization layer PS1 there is arranged a second carrier substrate TS2 with second functional structure FS2 arranged thereon and second thin-film cover DSA2.

Figure 7:
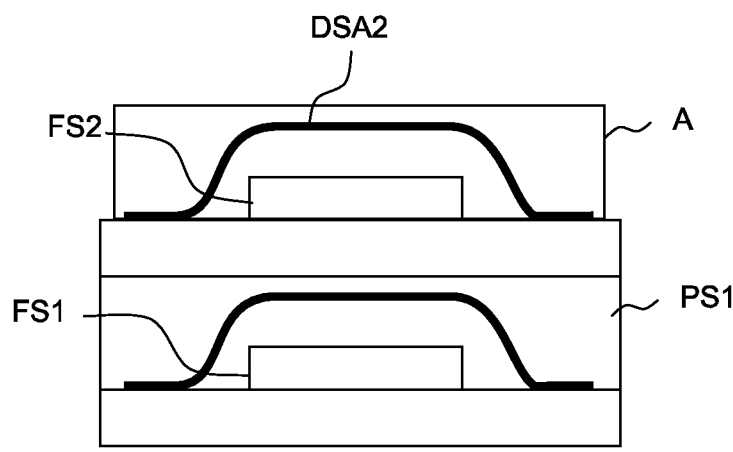
FIG. 7 shows one embodiment comprising a cover above a thin-film cover (second)

FIG. 7 shows one embodiment in which—in contrast to the embodiment in FIG. 6—the second thin-film cover DSA2 is also covered and, if appropriate, reinforced by a further cover A.

Figure 8:
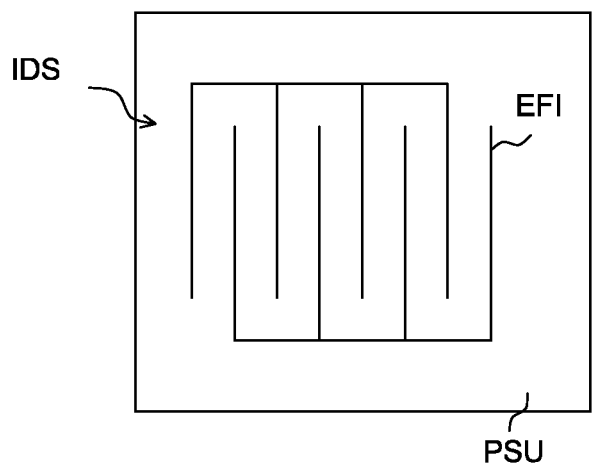
FIG. 8 shows an SAW structure.

FIG. 8 shows an SAW structure comprising electrode fingers EFI which are arranged alongside one another and in each case interconnected with one of two busbars. The electrode fingers are arranged on a piezoelectric substrate PSU and form an interdigital structure IDS.

Figure 9:
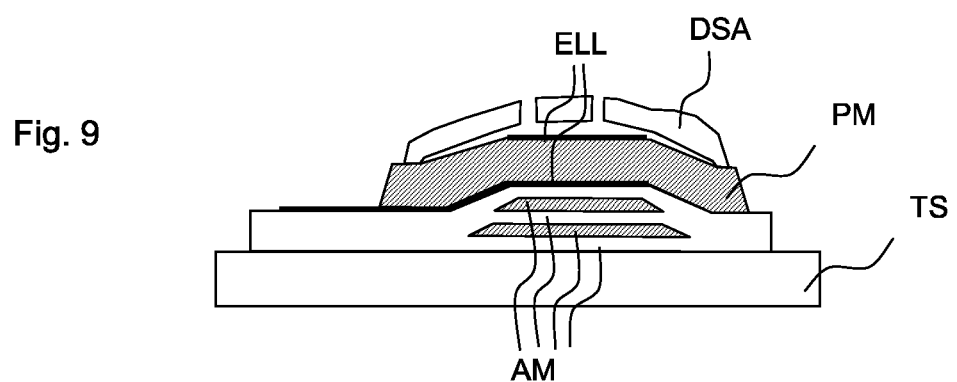
FIG. 9 shows a BAW structure.

FIG. 9 shows a BAW structure in which a piezoelectric material PM is arranged between two electrode layers ELL. An acoustic mirror AM comprising a multiplicity of layers having different acoustic impedances is arranged below the acoustically active region of the BAW structure. In this case, the layer stack is arranged on a carrier substrate TS.

Figure 10:
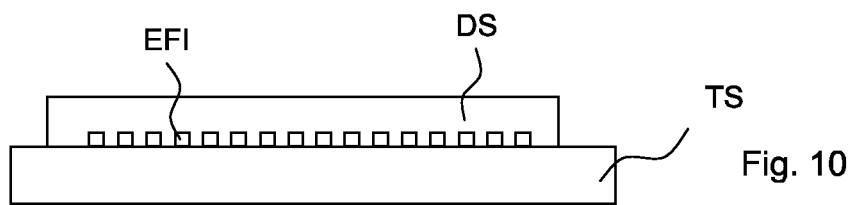
FIG. 10 shows a GBAW structure.

FIG. 10 shows a GBAW structure in which electrode fingers EFI—here shown in cross section—are arranged on a carrier substrate TS and are covered by a dielectric layer DS.

Figure 11:
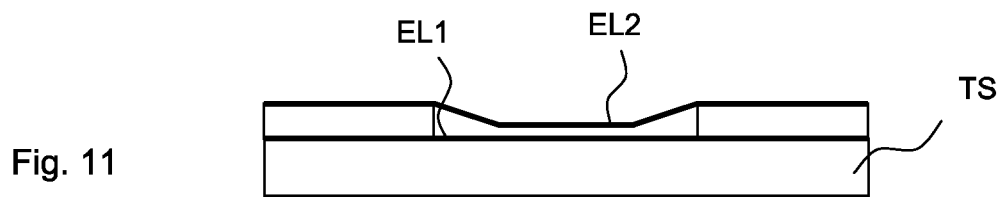
FIG. 11 shows a MEMS structure.

FIG. 11 shows an MEMS structure comprising two electrodes EL1, EL2, wherein at least the second electrode EL2 is to a certain extent mechanically flexibly suspended and movable.

The structures shown in FIGS. 8 to 11 can be appropriate as first functional structure or as second functional structure. Other functional structures are likewise possible.

Figure 12:
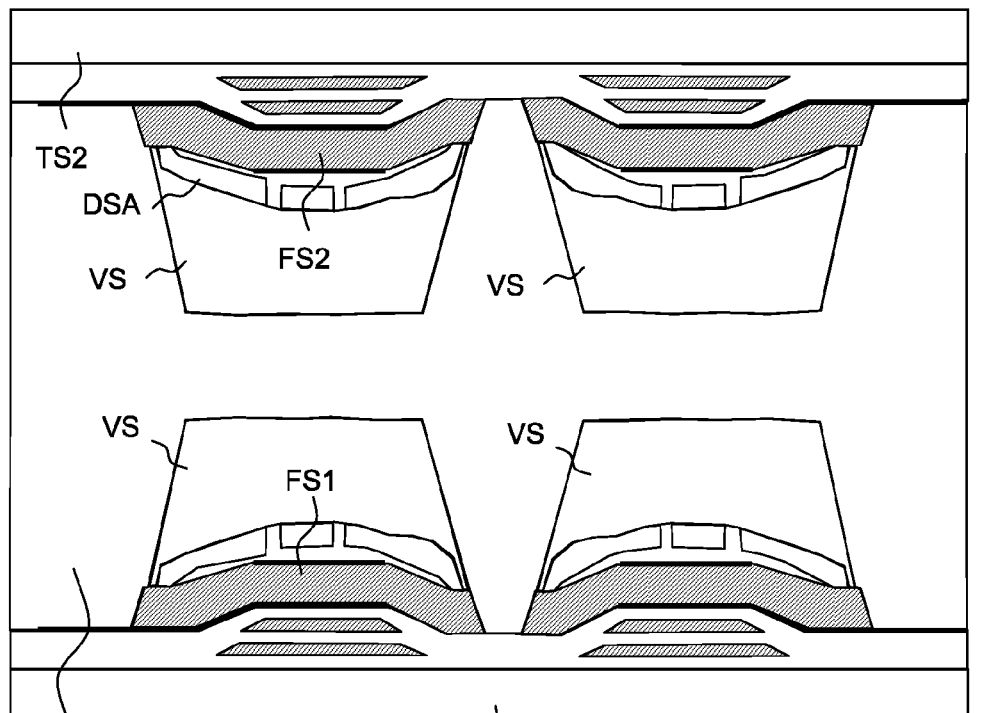
FIG. 12 shows one embodiment with BAW structures arranged in a mirrored fashion.

FIG. 12 shows one embodiment in which BAW structures are arranged mirror-symmetrically one above another. In this case, the mirror plane runs horizontally between reinforcement layers VS that mechanically reinforce the thin-film covers DSA. The component can be obtained by two component parts of the component in each case being joined together with their planarization layers PS1,2 "head to head". In this case, the reinforcement layers VS together with the corresponding thin-film cover form a cover of the acoustically sensitive regions which is so stable mechanically that the joining-together process, which can be carried out under high pressure and temperature, is withstood without any problems.

The reinforcement layer VS can comprise a silicon oxide, e.g., $SiO_2$ (silicon dioxide). In this case, $SiO_2$ can have a certain porosity. An impermeable reinforcement layer having low porosity is preferred, however, in order to improve the stability of the cover above the corresponding functional layer and to increase the impermeability.

Figure 13:
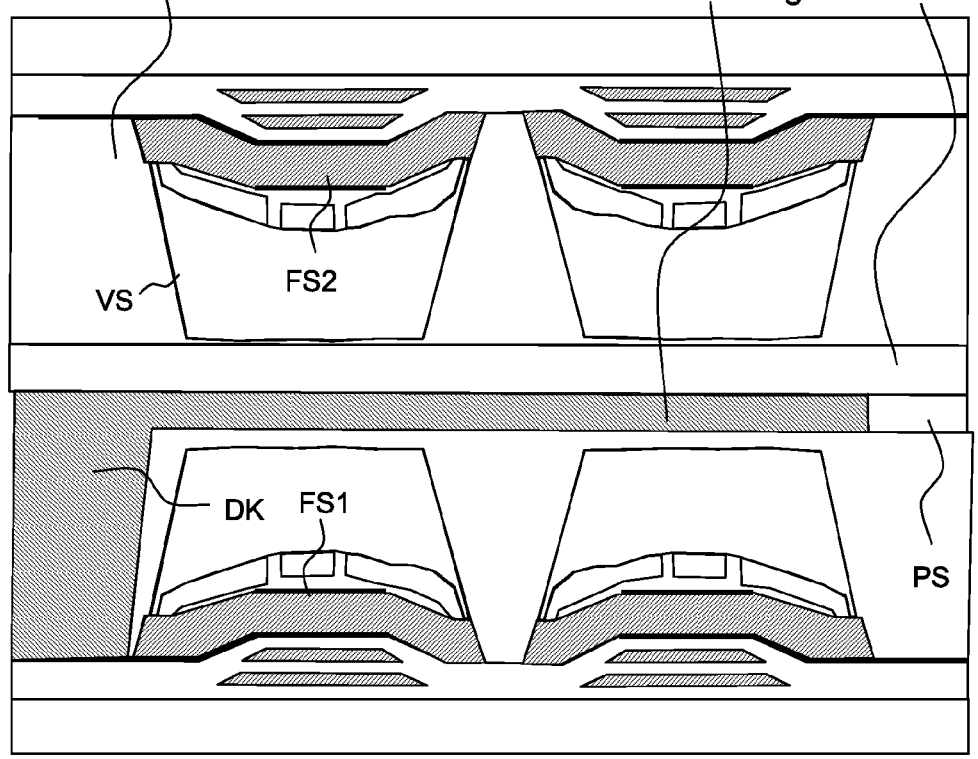
FIG. 13 shows one embodiment with plated-through hole and metallization.

FIG. 13 shows one embodiment in which, besides reinforcement layers VS, planarization layers PS and metallization layers M are also arranged between the functional structures FS1, FS2. Furthermore, the component comprises a plated-through hole DK interconnected with the metallization layer M. Via plated-through holes DK it is possible to implement sections of an interconnection in a vertical direction. By means of metallization layers M it is possible to structure sections of an interconnection of different functional structures in a horizontal direction.

Figure 14:
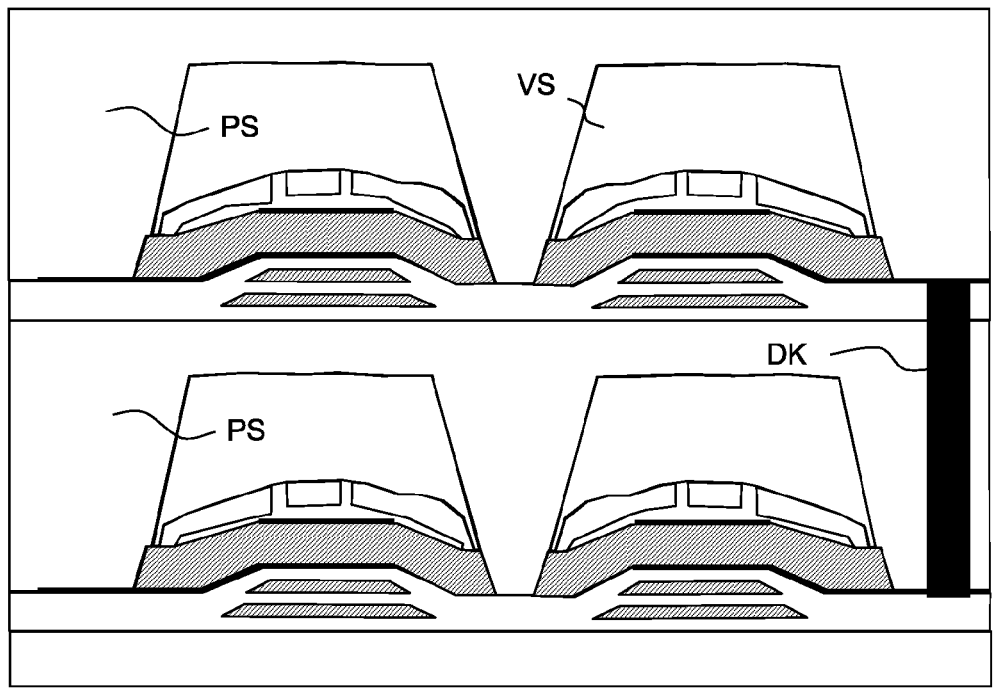
FIG. 14 shows one configuration with plated-through hole.

FIG. 14 shows one embodiment in which functional structures having a substantially identical construction are arranged one directly above another and are interconnected with one another via a plated-through hole DK.

Figure 15:
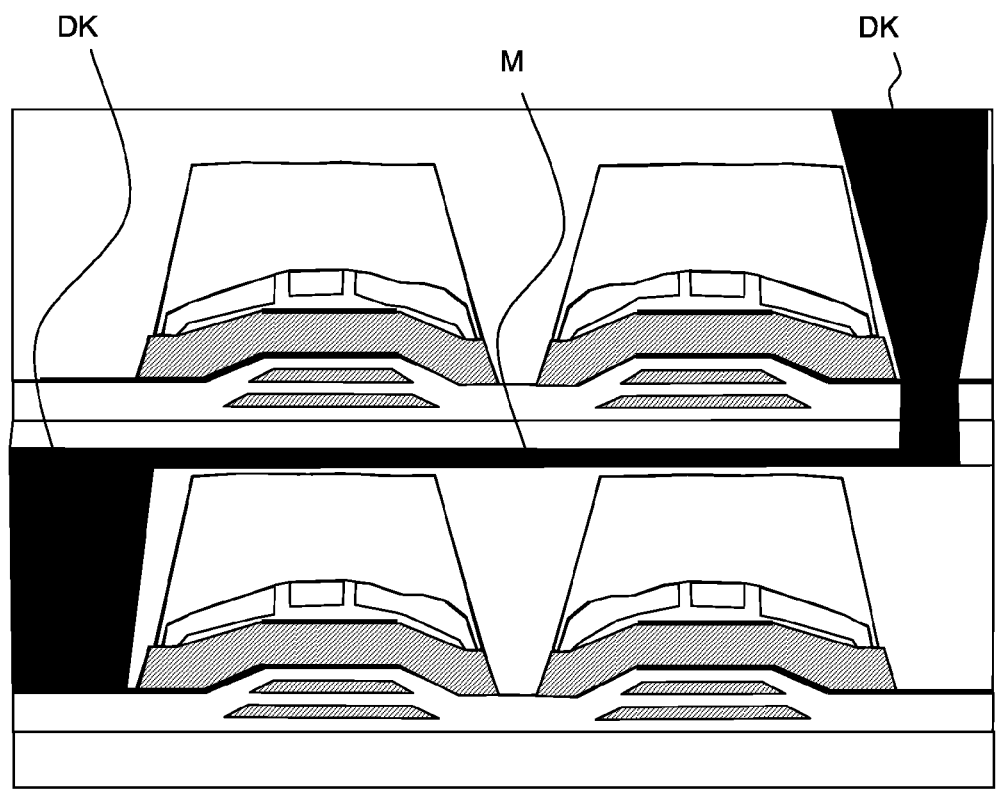
FIG. 15 shows a further configuration with plated-through hole and metallization.

FIG. 15 shows one embodiment of a component in which in addition to a plated-through hole DK for overcoming a horizontal section a metallization M is arranged between the functional structures.

Figure 16:
FIG. 16 shows one intermediate stage of a production method.

FIGS. 16 to 21 schematically depict important steps of one production method. In this regard, FIG. 16 shows a provided carrier substrate TS, on which a functional structure can be arranged.

Figure 17:
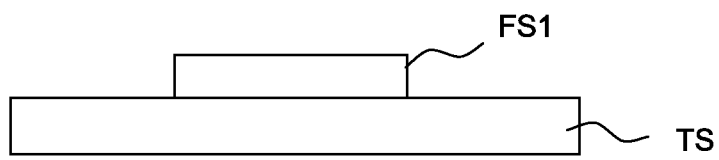
FIG. 17 shows a further intermediate stage.

FIG. 17 shows a functional structure FS1 arranged on the carrier substrate TS.

Figure 18:
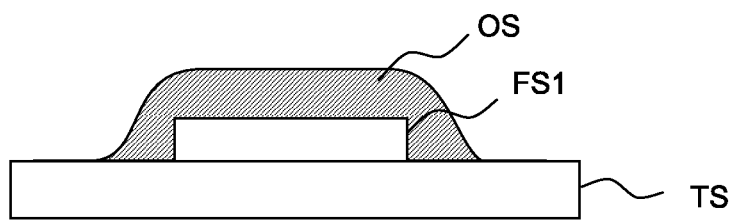
FIG. 18 shows a further intermediate stage.

FIG. 18 shows one intermediate stage in which the functional structure FS1 is covered by a sacrificial layer OS.

Figure 19:
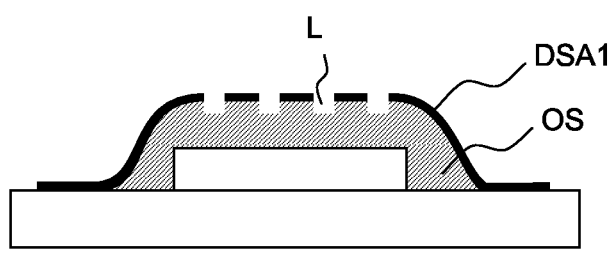
FIG. 19 shows a further intermediate stage.

FIG. 19 shows one intermediate stage in which a first thin-film cover DSA1 was deposited on the sacrificial layer OS and wherein holes L were subsequently structured into the thin-film cover DSA1.

Figure 20:
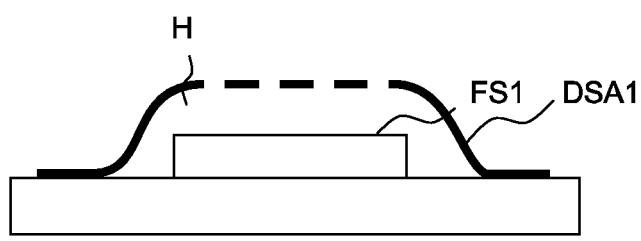
FIG. 20 shows a further intermediate stage.

FIG. 20 shows one intermediate stage in which the sacrificial layer OS was removed through the holes in the thin-film cover/first thin-film cover DSA1.

Figure 21:
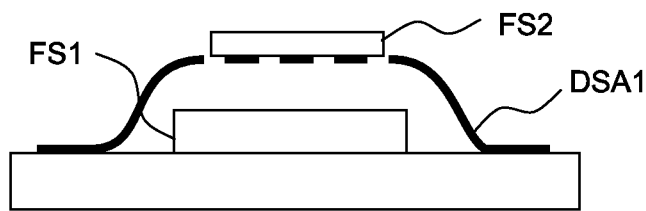
FIG. 21 shows the end result of a production method.

FIG. 21 shows the finished component in which the second functional structure FS2 was applied to the first thin-film cover DSA1.

FIGS. 22 to 27 show intermediate stages of an alternative production method.

Figure 22:
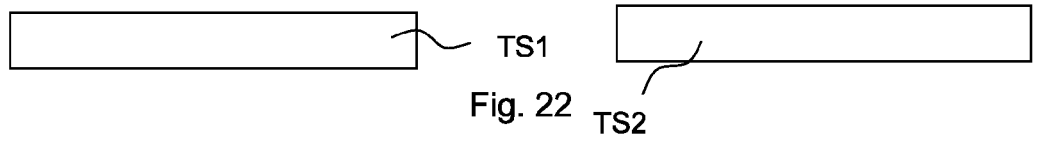
FIG. 22 shows a first intermediate result of an alternative production method.

A first carrier substrate TS1 and a second carrier substrate TS2 are provided simultaneously, as shown in FIG. 22.

Figure 23:
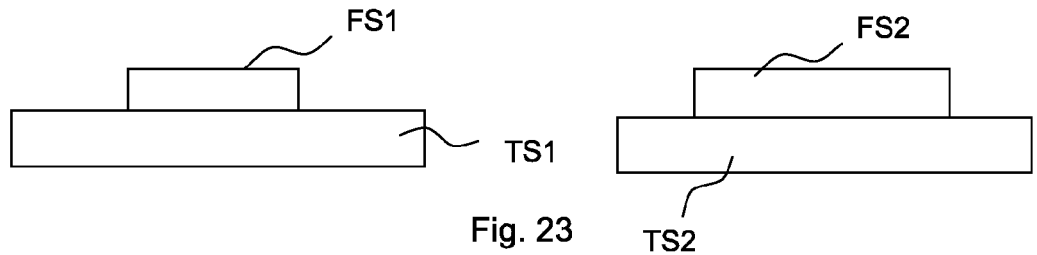
FIG. 23 shows a further intermediate stage.

A respective functional structure is arranged on each of the two carrier substrates, as shown in FIG. 23.

Figure 24:
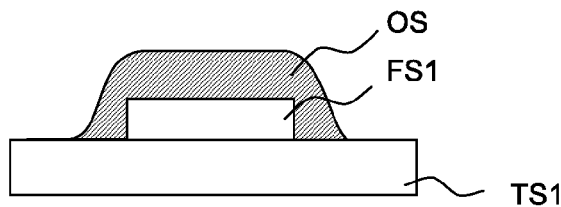
FIG. 24 shows a further intermediate stage.

FIG. 24 shows one intermediate stage in which a sacrificial layer OS was deposited on the first functional structure FS1.

Figure 25:
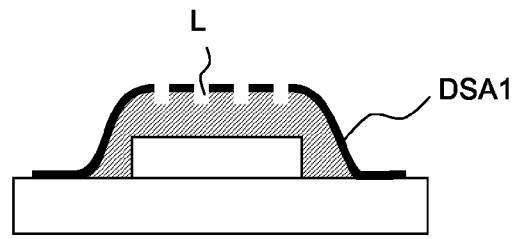
FIG. 25 shows a further intermediate stage.

FIG. 25 shows one intermediate stage in which the first thin-film cover DSA1 was deposited above the sacrificial layer and was provided with holes.

Figure 26:
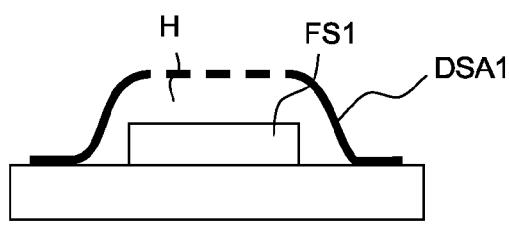
FIG. 26 shows a further intermediate stage.

FIG. 26 shows one intermediate stage in which the sacrificial layer was removed below the thin-film cover DS1.

Figure 27:
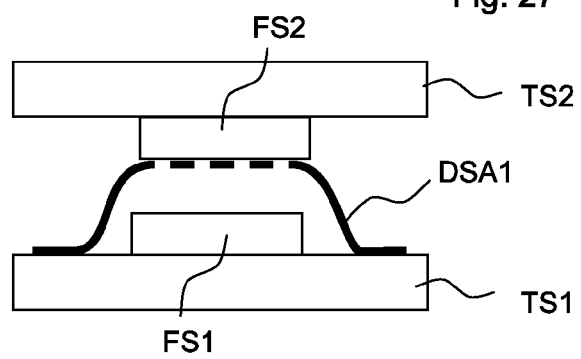
FIG. 27 shows the end result of the production method.

FIG. 27 shows the finished product in which the second carrier substrate TS2 with the second functional structure FS2, shown in FIG. 23, was applied to the thin-film cover DSA1 in "opposite" orientation.

The component is not restricted to one of the described or schematically depicted embodiments. Components comprising further layers, active or passive circuit elements or covers or combinations likewise constitute embodiments according to the invention.

The invention claimed is:

1. A component comprising:
   a first structure, a first thin-film cover and a second structure;
   wherein the first thin-film cover covers the first structure without touching the first structure,
   wherein the second structure is arranged directly on or above the first thin-film cover, and
   wherein at least one of the first and second structures comprises a MEMS structure.

2. The component according to claim 1, wherein the first structure and the second structure are each selected from: an SAW structure, a BAW structure, and a GBAW structure.

3. The component according to claim 1, wherein the first structure and the second structure substantially have the same construction or are of the same type, and are arranged either with an identical orientation with respect to one another one directly above the other or with a lateral offset one above the other.

4. The component according to claim 1, wherein the first and second structures are constructed symmetrically with respect to a mirror plane between the first and second structures and are arranged one directly above the other or with a lateral offset one above the other.

5. The component according to claim 1, wherein the first structure is arranged in a cavity between a carrier substrate and the first thin-film cover.

6. The component according to claim 1, wherein a planarization layer having a planar surface is arranged on the first thin-film cover.

7. The component according to claim 1,
wherein the first structure and the second structure in each case comprise an acoustically active region, and
wherein the acoustically active region of the first structure is acoustically decoupled with the acoustically active region of the second structure.

8. The component according to claim 1, further comprising:
a plated-through hole through the first thin-film cover;
wherein the first structure and the second structure in each case comprise an electrically conductive electrode, and
wherein the electrically conductive electrode of the first and second structures are interconnected via the plated-through hole.

9. The component according to claim 1, wherein the first structure and the second structure are interconnected and are together at least parts of a balun or duplexer circuit.

10. The component according to claim 1, further comprising a circuit element which is arranged between the first structure and the second structure and is interconnected at least with the first structure or the second structure.

11. The component according to claim 10, wherein the circuit element is a capacitive or inductive element.

12. The component according to claim 1, wherein the first thin-film cover comprises at least one layer produced by a thin film package technology and comprises a material selected from the group consisting of silicon, silicon nitride, aluminum nitride, aluminum oxide, a metal, and a polymer.

13. A method for producing a component, the method comprising:
providing a first carrier;
producing a first structure on the first carrier;
producing a first thin-film cover above the first structure, wherein the first thin-film cover covers the first structure without touching it, wherein the first structure is fully enclosed by the first carrier and the first thin-film cover; and
producing a second structure directly on or above the first thin-film cover, wherein at least one of the first and second structures comprises a MEMS structure.

14. The method according to claim 13, wherein the first structure and the second structure are each selected from: an SAW structure, a BAW structure, and a GBAW structure.

15. The method according to claim 13, wherein the first structure and the second structure comprise an acoustic device.

16. The method according to claim 13, wherein the first structure and the second structure are interconnected and are together at least parts of a balun or duplexer circuit.

17. The method for producing a component according to claim 13, further comprising:
applying a first sacrificial layer on the first structure;
depositing the first thin-film cover on the first sacrificial layer; and
removing the first sacrificial layer after the deposition of the first thin-film cover.

18. The method according to claim 13, wherein producing the first thin-film cover comprises producing at least one layer using a thin film package technology, and wherein the thin-film cover comprises a material selected from the group consisting of silicon, silicon nitride, aluminum nitride, aluminum oxide, a metal, and a polymer.

19. The method according to claim 13, further comprising arranging a capacitive or inductive circuit element between the first structure and the second structure and interconnecting the circuit element at least with the first structure or the second structure.

20. A method for producing a component, the method comprising:
producing a first and a second component part and joining together both component parts;
wherein producing the first component part comprises:
providing a first carrier,
producing a first structure on the first carrier,
producing a first thin-film cover above the first structure, wherein the first thin-film cover covers the first structure without touching it, and
wherein producing the second component part comprises:
providing a second carrier, and
producing a second structure on the second carrier, wherein at least one of the first and second structures comprises a MEMS structure.

* * * * *